United States Patent
Cohn et al.

(10) Patent No.: US 6,790,760 B1
(45) Date of Patent: Sep. 14, 2004

(54) METHOD OF MANUFACTURING AN INTEGRATED CIRCUIT PACKAGE

(75) Inventors: Charles Cohn, Wayne, NJ (US); Donald Earl Hawk, Jr., King of Prussia, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/621,110

(22) Filed: Jul. 21, 2000

(51) Int. Cl.$^7$ .................. H01L 21/44; H01L 21/48; H01L 21/50; H01L 21/76; H01L 23/48

(52) U.S. Cl. .................. 438/613; 438/106; 438/108; 438/123; 438/422; 438/111; 257/691; 257/698; 257/700; 257/678

(58) Field of Search .................. 438/618, 619, 438/617, 422, 108, 111, 123, 106, 611, 613, 614, 112, 626; 257/691, 697, 700, 678

(56) References Cited

U.S. PATENT DOCUMENTS

| | | | |
|---|---|---|---|
| 5,008,734 A | * 4/1991 | Dutta et al. | 257/693 |
| 5,063,175 A | * 11/1991 | Broadbent | 438/626 |
| 5,490,324 A | 2/1996 | Newman | |
| 5,562,971 A | * 10/1996 | Tsuru et al. | 428/209 |
| 5,629,559 A | * 5/1997 | Miyahara | 257/666 |
| 5,689,091 A | * 11/1997 | Hamzehdoost et al. | 174/255 |
| 5,796,170 A | * 8/1998 | Marcantonio | 257/786 |
| 5,814,883 A | * 9/1998 | Sawai et al. | 257/712 |
| 5,861,322 A | * 1/1999 | Caillat et al. | 438/107 |
| 6,022,787 A | * 2/2000 | Ma | 438/422 |
| 6,027,999 A | * 2/2000 | Wong | 438/637 |
| 6,060,378 A | * 5/2000 | Rolfson | 438/612 |
| 6,077,728 A | * 6/2000 | Yamasaki et al. | 438/125 |
| 6,140,707 A | * 10/2000 | Plepys et al. | 257/778 |
| 6,159,837 A | * 12/2000 | Yamaji et al. | 438/613 |
| 6,175,497 B1 | * 1/2001 | Tseng et al. | 361/704 |
| 6,200,889 B1 | * 3/2001 | Rolfson | 438/612 |
| 6,228,683 B1 | * 5/2001 | Manteghi | 438/112 |
| 6,277,705 B1 | * 8/2001 | Lee | 438/421 |
| 6,329,228 B1 | * 12/2001 | Terashima | 438/156 |
| 6,365,432 B1 | * 4/2002 | Fukutomi et al. | 438/106 |
| 6,440,770 B1 | * 8/2002 | Banerjee et al. | 438/106 |
| 6,465,882 B1 | * 10/2002 | Cohn et al. | 257/691 |

FOREIGN PATENT DOCUMENTS

| | | |
|---|---|---|
| EP | 0 645 811 A2 | 3/1995 |
| EP | 0 678 918 A2 | 10/1995 |
| EP | 0 849 793 A2 | 6/1998 |
| EP | 1 011 139 A1 | 6/2000 |
| GB | 2077036 A | 12/1981 |
| WO | WO 96/23612 | 8/1996 |

* cited by examiner

*Primary Examiner*—Matthew Smith
*Assistant Examiner*—Chuong Anh Luu

(57) ABSTRACT

A method of manufacturing an integrated circuit package such as a BGA package for use with an integrated circuit chip. The integrated circuit package has a substrate formed with a cavity that exposes a lower conductive level in the package so that connections between the integrated circuit chip and the lower conductive level may be formed to reduce the through holes formed in the substrate. As a result, additional signal line interconnections may be included in the substrate circuit package and/or the size of the integrated circuit chip may be decreased. Each of these may be implemented for enhanced electrical performance. The multiple wire bonding tiers in the substrate may also provide greater wire separation that eases wire bonding and subsequent encapsulation processes.

16 Claims, 5 Drawing Sheets

METHOD OF MANUFACTURING AN INTEGRATED CIRCUIT PACKAGE

FIELD OF THE INVENTION

The present invention relates generally to integrated circuits and, more particularly, to methods for manufacturing packages for integrated circuits and methods for manufacturing those packages.

BACKGROUND OF THE INVENTION

Ball grid array (BGA) integrated circuit packages (hereinafter BGA packages) are widely used for mounting integrated circuit chips because they provide several advantages over other packaging technologies. BGA packages allow multiple pin structures to be mounted in limited surface areas. Further, BGA packages are less susceptible to impact damage because the outer terminals of the BGA package are short and stubby. In addition, the BGA package has relatively short bond pad to solder ball traces that result in improved electrical performance.

FIG. 8 illustrates a typical BGA package. The BGA package includes a substrate 1, which may consist of a double sided or multilayer structure, an integrated circuit chip 3 mounted on the upper surface of the substrate 1 by an adhesive 2. Metal wires 4 electrically interconnect a plurality of bond pads 3a formed on the upper surface of the integrated circuit with bond pads 7 formed on the substrate 1. Also provided is a molding section 5 formed on the upper surface of the substrate 1 to encapsulate the integrated circuit chip 3 and the metal wires 4. Solder balls 6 are attached on the lower surface of the substrate 1. The bond pads 7 are connected to the solder balls 6 using plated through holes 8 formed in the substrate 1.

To fabricate this BGA package, the integrated circuit chip 3 is attached to the upper central portion of the substrate 1 by an adhesive 2 in a die bonding process. Thereafter, in a wire bonding process, the bond pads 3a formed on the upper surface of the integrated circuit 3 and the bond pads 7 formed on the substrate 1 are interconnected with the metal wires 4. Using a molding process, the integrated circuit 3, the metal wires 4, and a portion of the upper surface of the substrate 1 are encapsulated with epoxy to form the molding section 5. In a solder ball attaching process, the solder balls 6 are attached to the lower surface of the substrate 1.

While this BGA package provides advantages it does, however, have its drawbacks. For example, a large number of through holes are formed in the substrate 1, of a multilayer metallization structure, between the power and ground rings, and the respective internal planes. As a result, the electrical performance is degraded because the conductive paths for current flow through the internal power and ground planes are reduced. Accordingly, it is desirable to develop a BGA package that reduces this problem.

SUMMARY OF THE INVENTION

The present invention is directed to a process for manufacturing an integrated circuit package such as a BGA package for use with an integrated circuit chip. The substrate of the integrated circuit package is formed having a cavity that exposes a lower conductive level in the substrate so that connections between the integrated circuit and the lower conductive level may be formed; thus reducing the need for plated through hole connections from conductive layer to conductive layer. As a result, the conductive paths in the internal power and ground planes are not necessarily cut off by the plated through holes thus avoiding or reducing some of the electrical performance degradation suffered by prior techniques. In addition, the invention allows more signals to be added and/or the size of the integrated circuit to be reduced for enhanced electrical performance. The multiple bonding tier integrated circuit package may also provide greater wire separation that eases wire bonding and subsequent encapsulation processes.

Illustratively, the substrate of the integrated circuit package includes a conductive layer formed above a first dielectric layer and a second dielectric layer formed above the first conductive layer. The second dielectric layer has a cavity exposing a portion of the first conductive layer. Also provided is an integrated circuit, positioned above the second dielectric layer, coupled to the exposed portion of the first conductive layer.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
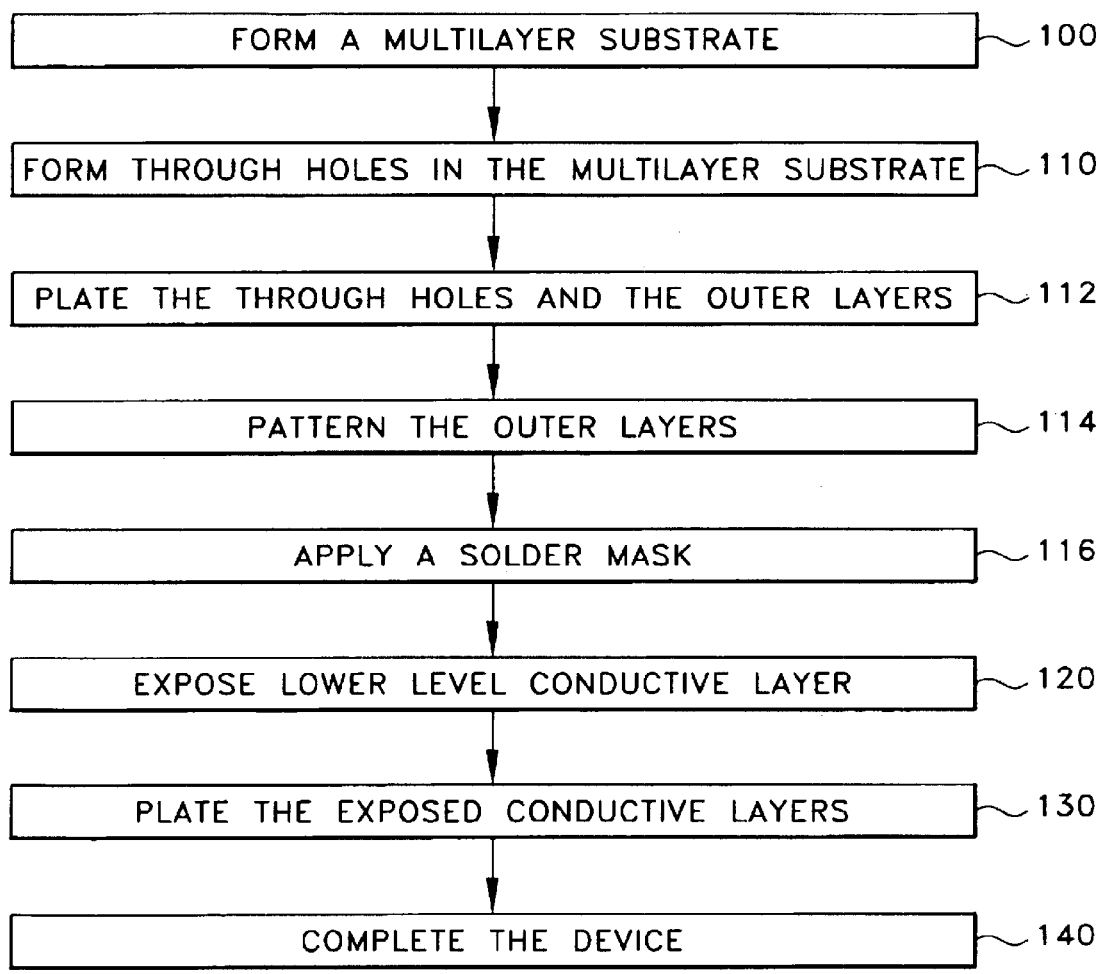
FIG. 1 is a flow chart diagram illustrating an exemplary process of the present invention for manufacturing a ball grid array package.
Figure 2:
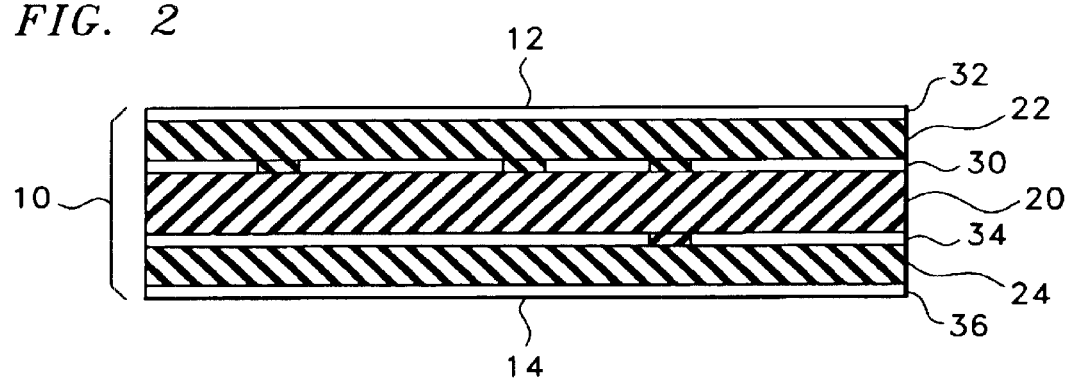
FIGS. 2–6 are schematic diagrams of a ball grid array substrate during successive stages of manufacture according to the process shown in FIG. 1.
Figure 3:
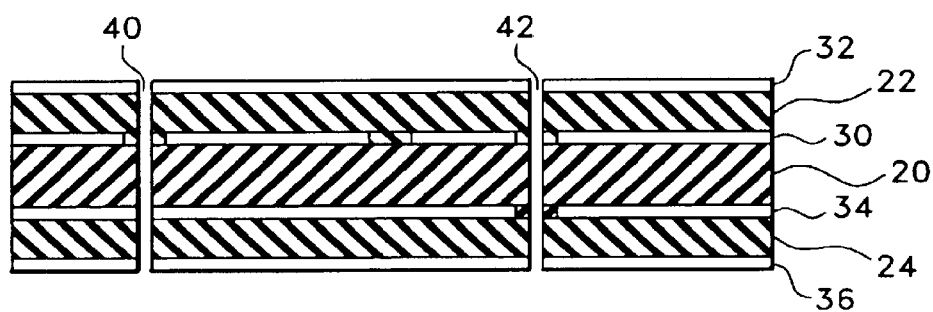
Figure 4:
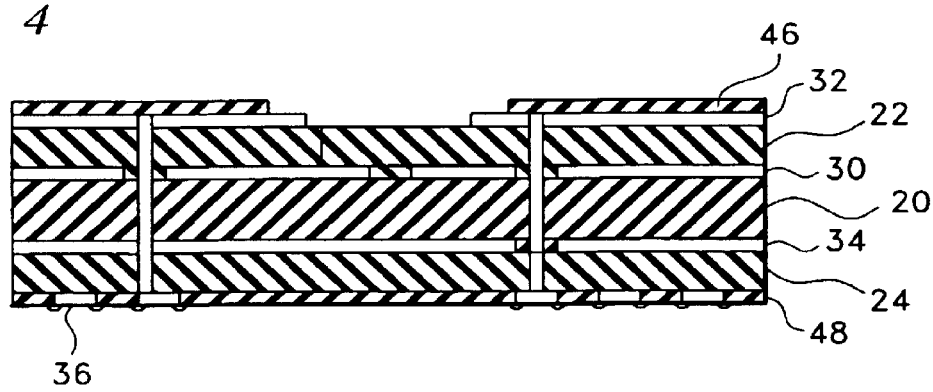
Figure 5:
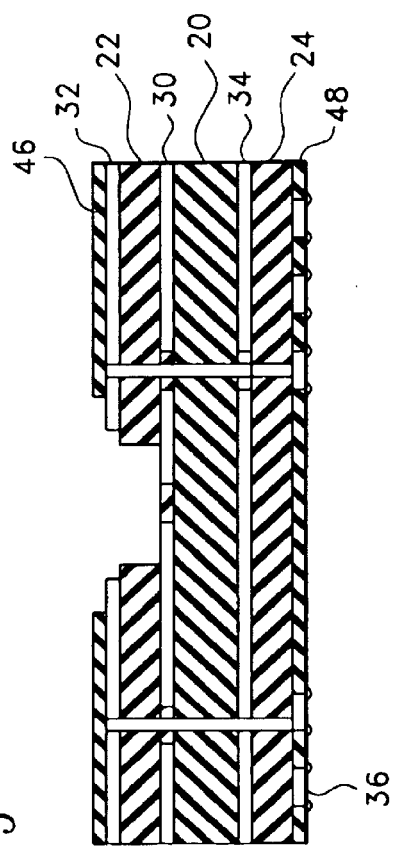

Referring now to the drawing, wherein like reference numerals refer to like elements throughout, FIG. 1 is a flow chart diagram illustrating the process for manufacturing an integrated circuit package according to an exemplary embodiment of the present invention. The process shown in FIG. 1 is described below with reference to FIGS. 2–6.

At step 100, a multilayer substrate 10 (FIG. 2) is provided. The process for manufacturing the multilayer substrate 10 is well known. The substrate includes insulating layers 20, 22, 24 and conductive layers 30, 32, 34, 36. The conductive layers 30, 32, 34, 36 may be patterned using standard techniques. These layers are patterned to form interconnections from the top 12 to the bottom 14 of the multilayer substrate 10. Conductive layers 30, 32, 34, 36 may be a metal such as copper or other suitable conductive material.

At step 110, through holes such as 40 and 42 (FIG. 3) are formed in the multilayer substrate 10 using standard processes. For example, the through holes may be formed by mechanical or laser drilling of the multilayer substrate 10. Although two through holes 40 and 42 are shown, a number of through holes may be formed in the multilayer substrate 10.

Next, at step 112, the through holes 40 and 42 and the outer conductive layers are plated. The outer conductive layers include conductive layers 32 and 36. The plating process includes forming a seed layer on the exposed surfaces including the through holes followed by an electroless plating flash and electroplating. The plating materials includes, for example, copper. At step 114, the conductive layers 32 and 36 are patterned using well-known processes. Then, at step 116, a solder mask 46 and 48 is applied to the conductive layers 32 and 36 and patterned to expose portions of the conductive layers 32 and 36 and insulating layer 22.

Next, at step 120, a cavity 50 (FIG. 5) is formed in the insulating layer 22 to expose conductive layer 30. Cavity 50 may be formed by routing, laser milling, plasma etching, or other cavity forming techniques. By exposing the conductive layer 30, wire bonds from the integrated circuit may be formed directly to at least two different bonding tiers within the multilayer substrate 10.

One or more of the exposed portions of the conductive layer 30 may form a power plane, ring or area. In this case, multiple bond pads of the integrated circuit may be interconnected to the exposed plane, ring, or area. Instead of a power plane, the exposed portions of the conductive layer 30 may form a ground plane. In this way, the need for multiple through holes for connecting to power or ground may be reduced or eliminated. Portions of the exposed conductive layer 30 may also include a combination of areas including one or more of a ground plane, power plane, or connections for signal lines.

At step 130, a conductive wire bondable material is formed on the exposed conductive areas of conductive layers 30, 32 and 36. The conductive material may include gold formed on nickel. In this case, nickel is plated onto the exposed portions of conductive layers 30, 32, and 36 and gold is plated onto the nickel.

Figure 6:
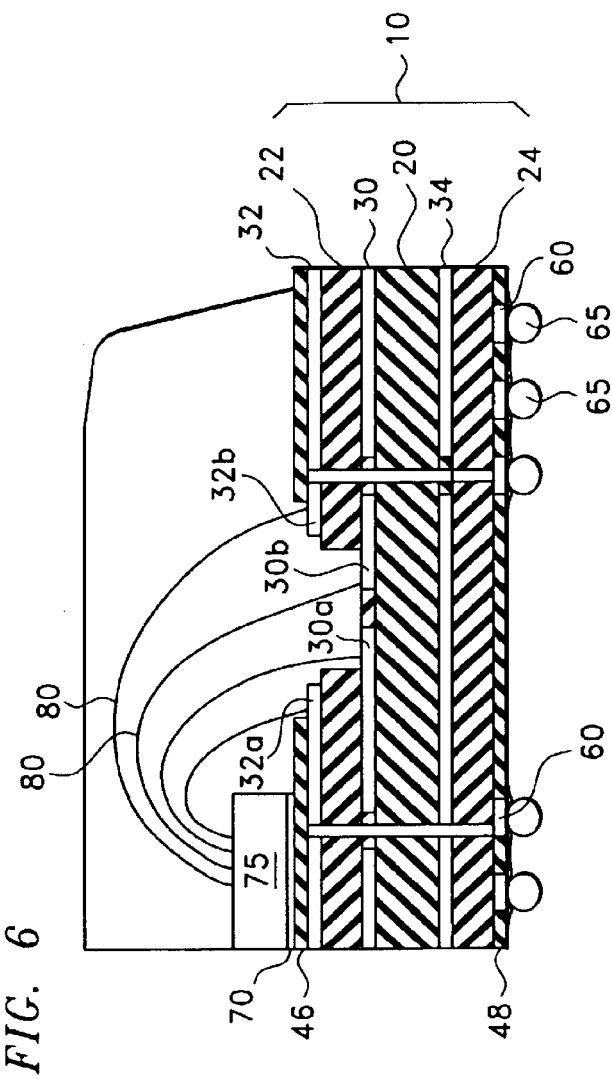

At step 140, the device is completed (FIG. 6). This includes coupling an integrated circuit chip 75 to the multilayer substrate 10 using an adhesive 70. Wire bonds 80 are formed between bond pads (not shown) on the integrated circuit and connection areas and/or bond pads 30a, 30b, 32a, 32b on the multilayer substrate 10. The connection areas are areas such as bond pads where the wires may be directly connected to conductive layers 30 and 32. In addition, the integrated circuit chip and the wire bonds are overmolded with an epoxy and solder balls 65 are coupled to the connecting pads 60 (formed from conductive layer 36) using conventional techniques.

Figure 7:
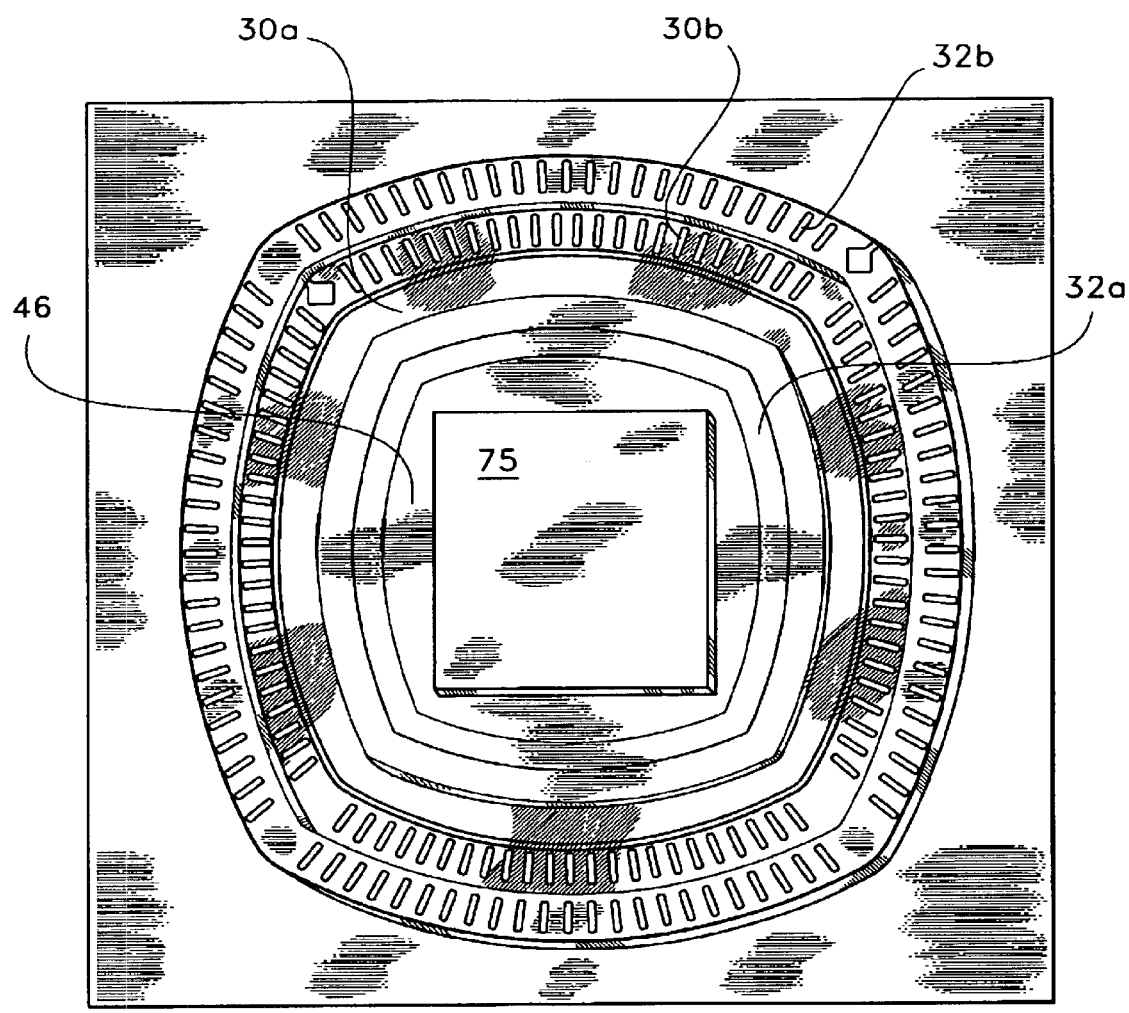
FIG. 7 is a top view of the ball grid array substrate shown in FIG. 5.
Figure 8:
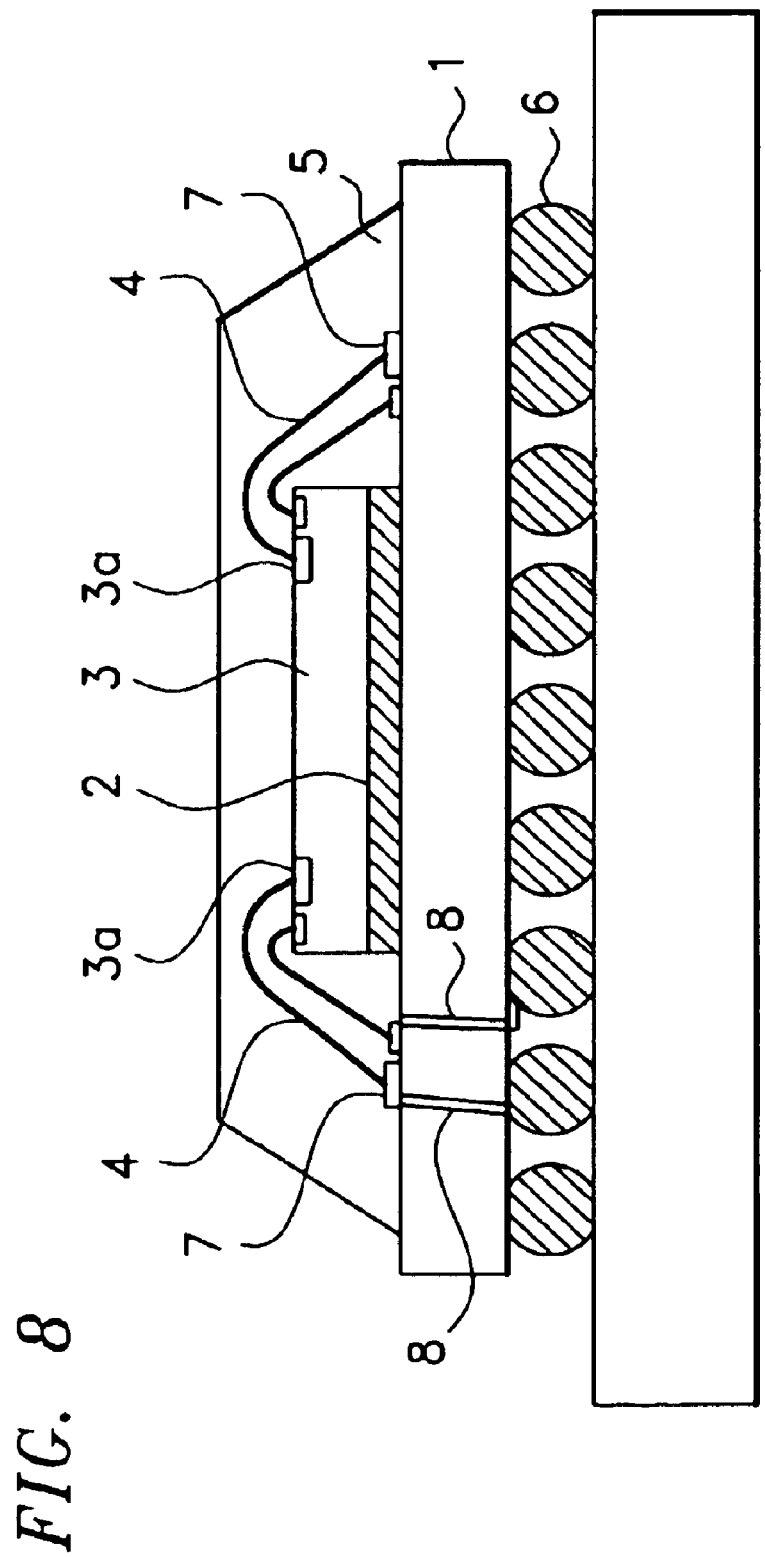
FIG. 8 is a schematic diagram of a conventional ball grid array package.

In the illustrative embodiment, the integrated circuit chip 75 is formed on a segment of the mask 70 (FIGS. 6 and 7). While only one wire bond is shown coupled to the ground plane, a plurality of wire bonds may be used to interconnect the integrated circuit 75 and the ground plane 32a. As a result, a plurality of through holes do not have to be formed in the multilayer substrate 10 for interconnecting the integrated circuit 75 to ground.

In addition, segment 30a of the conductive layer 30 may form a power plane and be electrically coupled to the integrated circuit chip 75. While only one wire bond is shown coupled to the power ring 30a, a plurality of wire bonds may be used to interconnect the integrated circuit chip 75 and the power plane 30a. As a result, a plurality of through holes do not have to be formed in the multilayer substrate 10 for interconnecting the integrated circuit chip 75 to the power plane 30a. Alternatively, segment 30b may form the power plane. The power plane, the ground plane, or other segment of the conductive layers may be formed as a continuous region along one, two, three or more sides of the integrated circuit or they may encircle the integrated circuit.

Although the invention has been described with reference to exemplary embodiments, it is not limited to those embodiments. For example, the exemplary embodiments described above include four conductive layers, however, the invention is applicable to substrates that include three or more conductive layers and associated insulating layers for separating those conductive layers. In addition, cavities may be formed in more than one of the dielectric layers of the substrate exposing one or more of the conductive layers in the substrate. Further, connections for signal lines, power, or ground, or combinations thereof, may be provided in the cavity of the substrate. Accordingly, the appended claims should be construed to include other variants and embodiments of the invention, which may be made by those skilled in the art without departing from the true spirit and scope of the present invention.

What is claimed:

1. A process for manufacturing an integrated circuit package comprising:
    (a) forming a substrate having a first dielectric layer, a conductive layer having a first region insulated from a second region and located above the first dielectric layer, and a second dielectric layer above the conductive layer, the second dielectric layer having a cavity wherein the first and second regions are exposed within the cavity and the first region insulated from the second region by a third dielectric layer which is not air; and
    (b) interconnecting a first lead of an integrated circuit to the exposed first region and interconnecting a second lead of the integrated circuit to the exposed second region.

2. The method of claim 1 wherein step (b) comprises:
    coupling a conductor to a bond pad formed on the integrated circuit; and
    connecting the conductor directly to the conductive layer.

3. The method of claim 1 further comprising providing one of a ground plane and a power plane in the exposed portion of the conductive layer.

4. The method of claim 3 further comprising providing at least one connection for a signal line in the exposed portion of the conductive layer.

5. The method of claim 1 further comprising providing at least one connection for a signal line in the exposed portion of the conductive layer.

6. The method of claim 1 further comprising forming multiple interconnections between the integrated circuit chip and the conductive layer.

7. A method of manufacturing a substrate adapted to receive an integrated circuit chip comprising:
    (a) forming a first dielectric layer on a substrate;
    (b) forming a conductive layer having a first region insulated from a second region, above the first dielectric layer;
    (c) forming a second dielectric layer above the conductive layer; and
    (d) forming a cavity in the second dielectric layer to expose the first and second regions of the conductive layer and coupling a first lead of the integrated circuit chip to the exposed first region and coupling a second lead of the integrated circuit to the exposed second region, the first region insulated from the second region by a third dielectric layer which is not air.

8. The method of claim 7 wherein steps (a), (b), and (c) occur prior to step (d).

9. The method of claim 7 further comprising:
providing a contact area to a ground plane by exposing the portion of the conductive layer.

10. The method of claim 7 further comprising:
(e) forming plated through holes in the substrate.

11. The method of claim 10 wherein step (e) is performed prior to step (d).

12. The method recited in claim 7, further comprising coupling the integrated circuit chip to the substrate.

13. A method of manufacturing a substrate adapted to receive an integrated circuit chip comprising:
(a) forming a first dielectric layer on a substrate;
(b) forming a conductive layer having a first region insulated from a second region, above the first dielectric layer;
(c) forming a second dielectric layer above the conductive layer;
(d) forming a second conductive layer above the second dielectric layer; and
(e) forming a cavity in a first region of the second dielectric layer to expose the first and second regions of the first conductive layer and coupling a first lead of the integrated circuit chip to the exposed first region and a second lead of the integrated circuit chip to the exposed second region.

14. The process of claim 13 wherein step (d) further comprises providing the second conductive layer on regions other than the first region.

15. The process of claim 13 wherein step (d) further comprises removing a portion of the conductive layer formed above the first region.

16. The method recited in claim 13, further comprising coupling the integrated circuit chip to the substrate.

\* \* \* \* \*